(12) United States Patent
Shi

(10) Patent No.: US 11,061,386 B2
(45) Date of Patent: Jul. 13, 2021

(54) METHOD AND SYSTEM TO ROUTE SEMICONDUCTOR PARTS TO MACHINES DISTRIBUTED IN A MULTI-BUILDING PLANT

(71) Applicant: SMARTFABS CORPORATION, College Station, TX (US)

(72) Inventor: Weiping Shi, College Station, TX (US)

(73) Assignee: SMARTFABS CORPORATION, College Station, TX (US)

(*) Notice: Subject to any disclaimer, the term of this patent is extended or adjusted under 35 U.S.C. 154(b) by 120 days.

(21) Appl. No.: 16/079,130

(22) PCT Filed: May 3, 2018

(86) PCT No.: PCT/US2018/030887
§ 371 (c)(1),
(2) Date: Aug. 23, 2018

(87) PCT Pub. No.: WO2018/213014
PCT Pub. Date: Nov. 22, 2018

(65) Prior Publication Data
US 2020/0401118 A1    Dec. 24, 2020

Related U.S. Application Data

(60) Provisional application No. 62/506,692, filed on May 16, 2017.

(51) Int. Cl.
*G05B 19/418* (2006.01)

(52) U.S. Cl.
CPC ... *G05B 19/41865* (2013.01); *G05B 19/4189* (2013.01); *G05B 19/41815* (2013.01);
(Continued)

(58) Field of Classification Search
CPC ........ G05B 19/41815; G05B 19/41865; G05B 19/4189; G05B 19/41895;
(Continued)

(56) References Cited

U.S. PATENT DOCUMENTS

| 5,102,495 A | 4/1992 | Maher et al. |
| 5,325,304 A | 6/1994 | Aoki |

(Continued)

OTHER PUBLICATIONS

International Search Report & Written Opinion received in PCT/US18/30887 dated Jul. 27, 2018, pp. 11.
(Continued)

*Primary Examiner* — Michael J Huntley
(74) *Attorney, Agent, or Firm* — Zhong Law, LLC

(57) ABSTRACT

A system and method relating to determining, by a processing device, a first number of parts waiting to be processed in a subsequent step by a plurality of machines housed in a plurality of buildings interconnected by rails, determining a second number of parts that the plurality of machines housed in the plurality of buildings is capable of processing in the subsequent step of the manufacture process over a determined period of time, calculating a capability occupancy ratio based on the first number and the second number for each one of the plurality of buildings, determining a target building of the plurality of buildings based on the capability occupancy ratio, and causing to dispatch the part to the target building via the rails.

20 Claims, 3 Drawing Sheets

(52) U.S. Cl.
CPC .............. *G05B 2219/32268* (2013.01); *G05B 2219/32396* (2013.01); *G05B 2219/45031* (2013.01)

(58) Field of Classification Search
CPC .......... G05B 2219/32268; G05B 2219/32396; G05B 2219/45031
See application file for complete search history.

(56) References Cited

U.S. PATENT DOCUMENTS

| | | | | |
|---|---|---|---|---|
| 5,335,601 | A * | 8/1994 | Matsumoto | B61L 23/005 104/88.01 |
| 5,623,413 | A * | 4/1997 | Matheson | B61L 27/0027 701/117 |
| 5,955,857 | A * | 9/1999 | Kwon | H01L 21/67766 318/568.11 |
| 6,285,951 | B1 * | 9/2001 | Gaskins | G06Q 10/047 701/533 |
| 6,290,188 | B1 * | 9/2001 | Bassett | B61L 23/34 246/1 C |
| 2001/0010950 | A1 | 8/2001 | Savage et al. | |
| 2004/0073331 | A1 * | 4/2004 | Chang | G05B 19/41865 700/223 |
| 2005/0114202 | A1 | 5/2005 | Chua et al. | |
| 2007/0282474 | A1 * | 12/2007 | Schmidt | G05B 19/41865 700/99 |
| 2007/0293978 | A1 * | 12/2007 | Wurman | C07C 253/34 700/213 |
| 2012/0027544 | A1 * | 2/2012 | Wang | H01L 21/67294 414/222.01 |
| 2014/0199138 | A1 | 7/2014 | van der Meulen et al. | |
| 2014/0271083 | A1 * | 9/2014 | Caveney | H01L 21/67196 414/749.5 |
| 2018/0300691 | A1 * | 10/2018 | Cui | B62D 61/06 |
| 2019/0163170 | A1 * | 5/2019 | Hsu | H01L 21/67727 |

OTHER PUBLICATIONS

Zvei. "Manufacturing Execution Systems (MES)" Jul. 2011—Retrieved from <https://www.proleit.com/fileadmin/user_upload/Englisch/Content/04_Solutions/MES/ZVEI_MES_Brochure_EN.pdf>.

* cited by examiner

METHOD AND SYSTEM TO ROUTE SEMICONDUCTOR PARTS TO MACHINES DISTRIBUTED IN A MULTI-BUILDING PLANT

RELATED APPLICATION

This application claims priority to International Patent Application No. PCT/CN2018/030887 filed on May 3, 2018, which claims priority to U.S. Provisional Application 62/506,692 filed May 16, 2017, the contents of which are incorporated by reference in their entirety

TECHNICAL FIELD

The present disclosure relates to a system and method to route manufacture parts to machines in different buildings of a plant, and in particular, to a system and method to route semiconductor parts (e.g., semiconductor wafers or apparatus that holds wafers) to wafer fabrication machines distributed in multiple buildings of the plant.

BACKGROUND

A manufacture process may include multiple fabrication steps to convert raw materials to the final product. A plant may contain machines for performing steps of the manufacturing process. These machines can be located in different buildings of the plant. These machines can be different types of machineries for performing different types of fabrication steps. Alternatively, these machines can be a same type of machineries that are programmed to perform these fabrication steps. The buildings of the plant may be connected by rails. After each fabrication step, the intermediately-processed parts may be shipped by carriers on the rails to one of available machines in other buildings to perform the next fabrication step.

BRIEF DESCRIPTION OF THE DRAWINGS

The disclosure will be understood more fully from the detailed description given below and from the accompanying drawings of various embodiments of the disclosure. The drawings, however, should not be taken to limit the disclosure to the specific embodiments, but are for explanation and understanding only.

DETAILED DESCRIPTION

Figure 1:
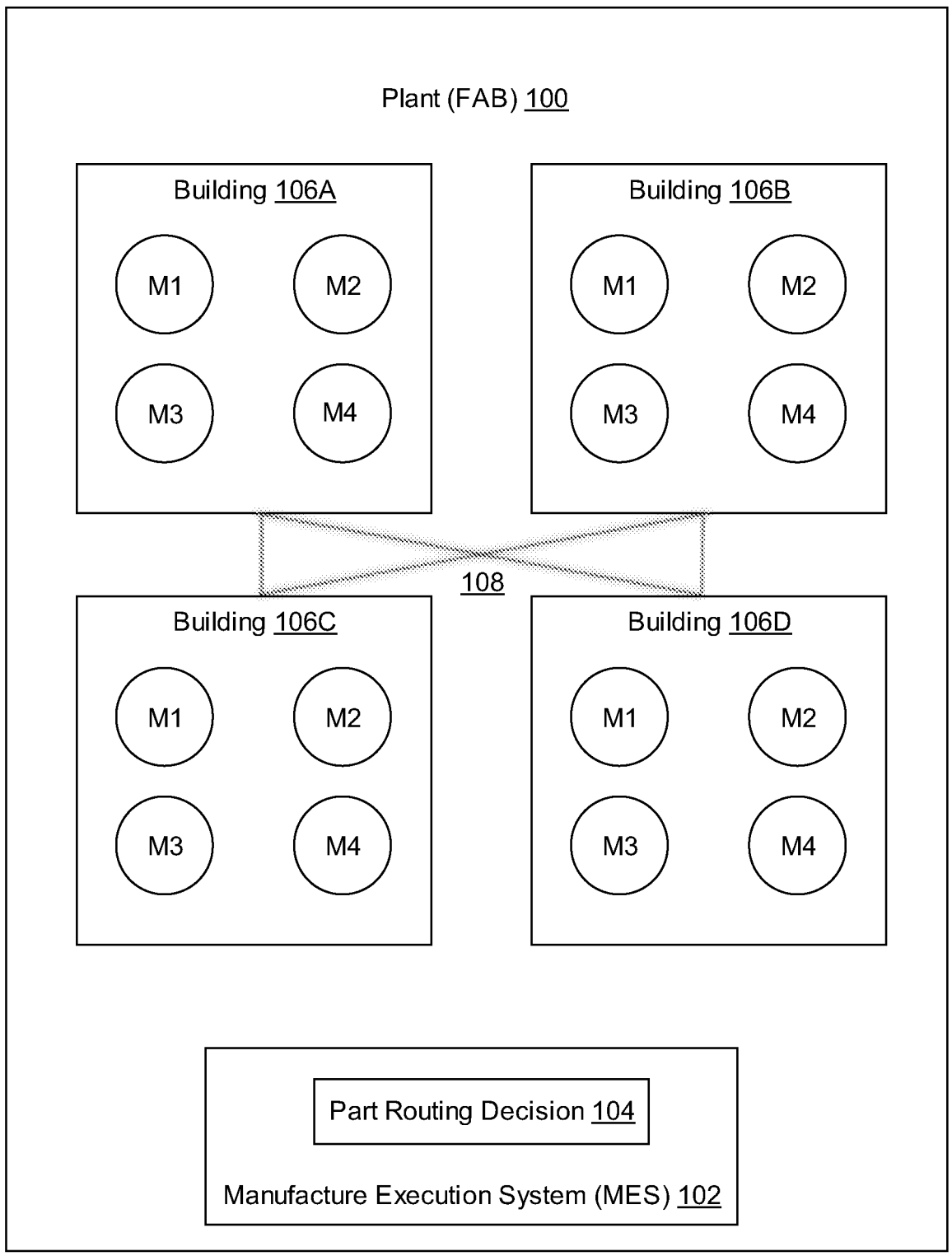
FIG. 1 illustrates a plant including a manufacture execution system (MES) according to an implementation of the present disclosure.

In one implementation, the plant may be a semiconductor manufacturer (referred to as a "FAB"). The FAB may include several buildings to house semiconductor fabrication machines. In another implementation, the plant can be a semiconductor package factory where manufactured silicon dies are tested and packaged. The manufacture parts can be semiconductor wafers that may undergo many processing steps before turning into end products (e.g., integrated circuits). The processing steps may include particle deposition steps, etching steps, patterning steps, and electrical property modification steps. These steps may be carried out by machines in different buildings. Thus, after each processing step, the processed parts may be shipped by carriers to another machine in another building for further processing. Normally, a number (e.g., up to 25) of semiconductors wafers are processed and transported together in an apparatus. The wafers in the apparatus are referred to as a wafer lot.

Each step in the manufacture process may be performed by a type of fabrication machines housed in a building. Further, fabrication machines of a particular type can be located in different buildings that are connected by rails for transporting the wafers or wafer lots at different stages of manufacturing across buildings.

Each fabrication machine may have a certain capacity to process a certain number of wafers associated with a certain step at a given time. Thus, instead of performing all the steps by the machines located in a single building, a wafer lot may be fabricated during the manufacture process by machines located in different buildings. The overall operation efficiency of the plant may depend on where (or which building) to ship the parts after finishing a particular step in the manufacture process. The efficiency improvements may include the reduction of the time to produce semiconductor products and the reduction of the number of trips to transport the wafer lots among different buildings. Since the transportation system takes time to transport wafer lots, and the transportation system has an upper limit on the number of wafer lots that can be transported at any time, the efficiency also includes consideration of the utilization of the transportation system. The utilization can be a measurement of whether the routes between buildings are congested at the time to transport the wafers or wafer lots. Implementations of the present disclosure provide a technical solution that can significantly improve the operation efficiency of the plant.

Implementations of the present disclosure may include a manufacture execution system (MES) that may schedule and issue instructions to control the transportation of wafers and wafer lots between buildings housing machines. In one implementation, the MES may include a computer system that may further include a hardware processor programmed with a part routing decision component. The part routing decision component may calculate a routing plan and issue instructions to route wafers or wafer lots among fabrication machines in different buildings. The part routing decision component can be an add-on component as an improvement to the MES that is already implemented at the plant.

In one implementation, the part routing decision component may employ a variety of factors to calculate the routing plan and issue instructions to route of wafers and wafer lots according to the routing plan after wafers (or wafer lots) had been processed at the prior step S-1 in a sequence of steps. The factors employed may include a number of waiting wafers or wafer lots (represented by WIP (P, S, B)) of a particular product P for a particular step S in a particular building B, and a number of wafers or wafer lots (represented by Capability (P, S, B)) that can be processed by machines of the product P for the following step S in building B.

In one implementation, the ratio R=WIP(P, S, B)/Capability(P, S, B) may be employed to determine where to transport wafers (or wafer lots) after step S-1, where WIP(P, S, B) is the number of waiting wafers (or wafer lots) of a product P at step S in a building B for a current time period (the current time period may extend to a future time point), and Capability(P, S, B) is the number of wafers (or wafer lots) of product P at step S that can be processed by equipment in building B in a time period now or in the future. In the above description, P is an identifier for a product, S is an identifier for a particular step in the manufacture process, and B is an identifier to identify buildings of the plant that house fabrication machines.

The part routing decision component may determine or calculate WIP(P, S, B) and Capability(P, S, B) based on current production information already recorded by the MES. Alternatively, the part routing decision component may estimate WIP(P, S, B) and Capability(P, S, B) based on different types of rules invoked according to a schedule (e.g., daily, hourly etc.) or based on historical data. In one implementation, the target building B* can be the building that is associated with the least ratio R(P, S, B*), where R(P, S, B*)=min {R(P, S, Bi), i=1, 2, ..., N}, where i is an index for buildings. Thus, after step S-1, the part routing decision component may issue instructions to cause the wafer or the wafer lot to transport from the current building housing fabrication machines performing step S-1 to building B* housing machines for performing step S.

Figure 3:
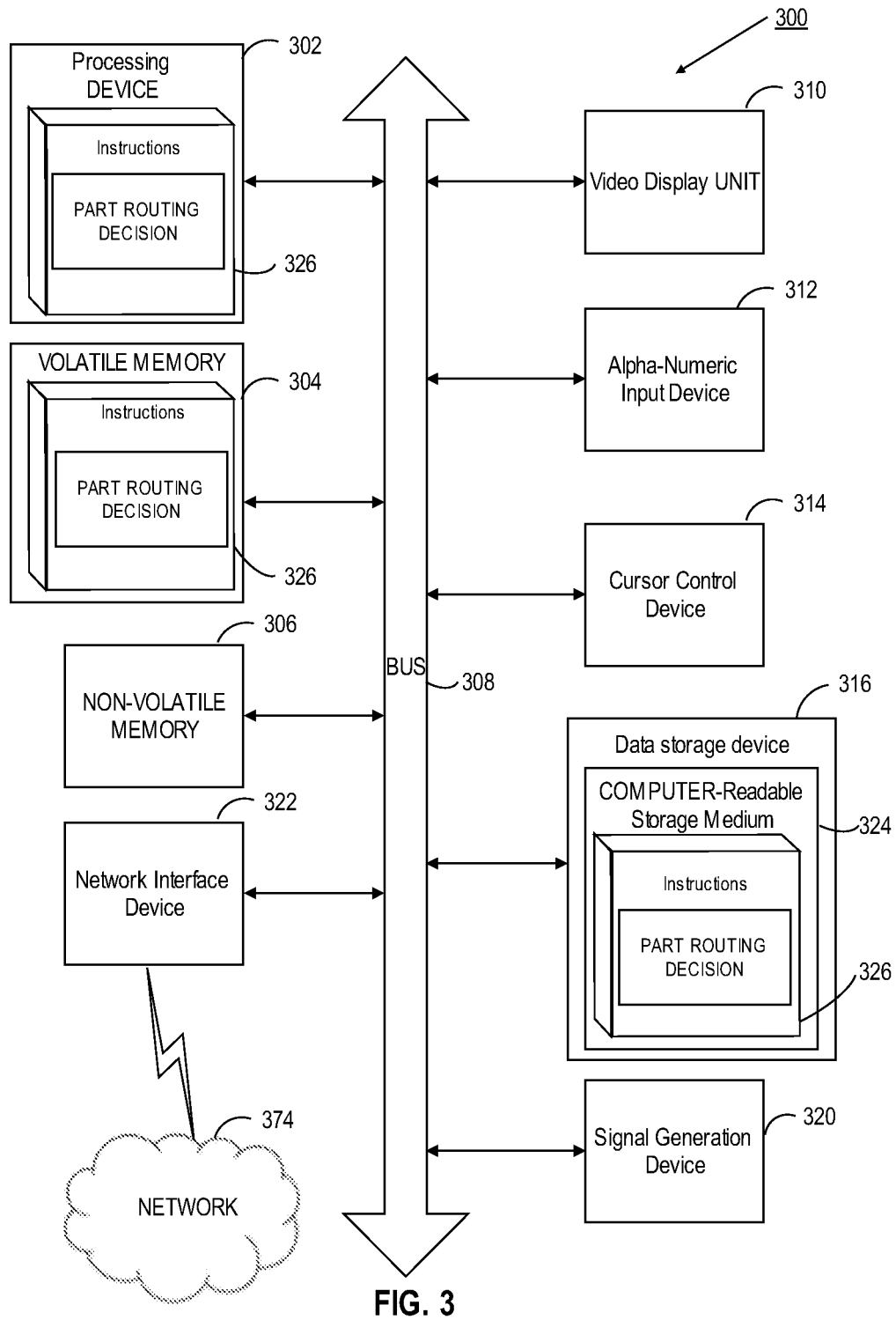
FIG. 3 depicts a block diagram of a computer system operating in accordance with one or more aspects of the present disclosure.

FIG. 1 illustrates a plant 100 including a manufacture execution system (MES) 102 according to an implementation of the present disclosure. Plant 100 may include buildings (106A-106D) that are interconnected via rails 108. In some implementations, rails 108 may provide pairwise connection tracks between any two buildings. In some other implementations as shown in FIG. 1, rails 108 may provide pairwise connections between some buildings but not all of the buildings due to physical limitations of the plant. Implementations of the present disclosure are not limited to any particular configuration of rails 108. Each building 106A-106D may house different types of machines (M1, M2, M3, M4). Each machine may perform a processing step in a sequence of steps to manufacture the end products. Rails 108 may include tracks on which carriers may travel to transport wafers or wafer lots among buildings. In one implementation, MES 102 can be a computer system (as shown in FIG. 3) including a processing device (e.g., a central processing unit (CPU)). MES 102 may also include or otherwise be communicatively coupled to a storage device (not shown). The storage device may include a database to store information associated with fabrication machines in different buildings. The information may include the number of wafers or wafer lots at a machine waiting to be processed for a specific step. The storage device may be in an independent system outside of MES or may even be at a remote location such as in the cloud.

In one implementation, the processing device of MES 102 may execute a part routing decision component 104 to determine how to transport parts that are being processed among fabrication machines in different buildings. Part routing decision component 104 may determine which building to send the wafers or wafer lots based on one or more factors including estimated ratios of parts in a building to be processed at a step over the estimated capability of machines to perform that step in the building. In response to determining these ratios, part routing decision component 104 may issue control instructions to cause to dispatch parts from the last fabrication step to the building that is associated with the least ratio value.

Figure 2:
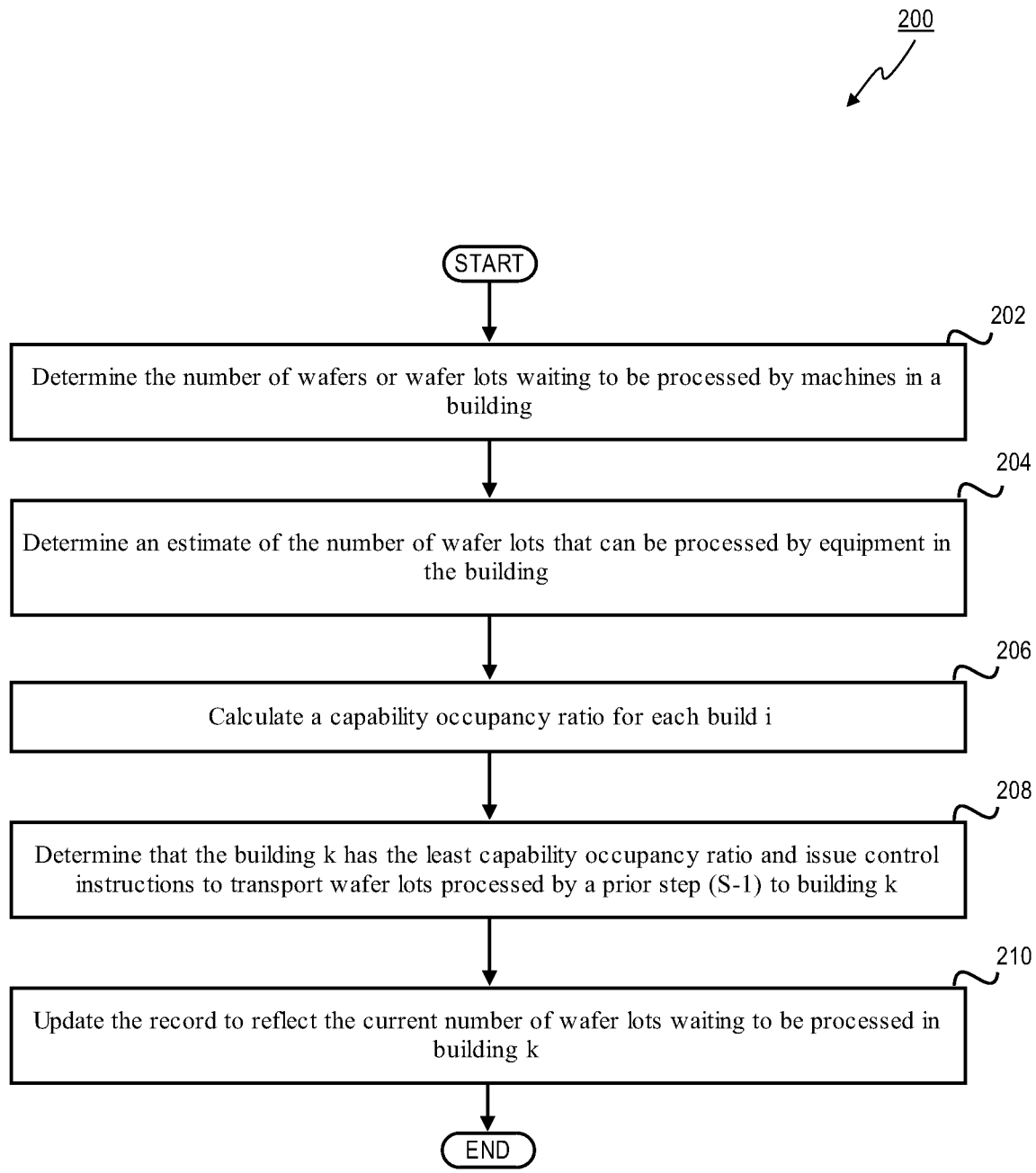
FIG. 2 depicts a flow diagram of a method for issuing control instructions to transport wafer lots to machines in different buildings according to an implementation of the present disclosure.

FIG. 2 depicts a flow diagram of a method 200 for issuing control instructions to transport wafer lots to machines in different buildings according to an implementation of the present disclosure. Method 200 may be performed by processing devices that may comprise hardware (e.g., circuitry, dedicated logic), computer readable instructions (e.g., run on a general purpose computer system or a dedicated machine), or a combination of both. Method 200 and each of its individual functions, routines, subroutines, or operations may be performed by one or more processors of the computer device executing the method. In certain implementations, method 200 may be performed by a single processing thread. Alternatively, method 200 may be performed by two or more processing threads, each thread executing one or more individual functions, routines, subroutines, or operations of the method.

For simplicity of explanation, the methods of this disclosure are depicted and described as a series of acts. However, acts in accordance with this disclosure can occur in various orders and/or concurrently, and with other acts not presented and described herein. Furthermore, not all illustrated acts may be needed to implement the methods in accordance with the disclosed subject matter. In addition, those skilled in the art will understand and appreciate that the methods could alternatively be represented as a series of interrelated states via a state diagram or events. Additionally, it should be appreciated that the methods disclosed in this specification are capable of being stored on an article of manufacture to facilitate transporting and transferring such methods to computing devices. The term "article of manufacture," as used herein, is intended to encompass a computer program accessible from any computer-readable device or storage media. In one implementation, method 200 may be performed by a processing device executing part routing decision component 104 as shown in FIG. 1.

Referring to FIG. 2, at 202, the processing device executing part routing decision component 104 may, for step S in a sequence of steps of a manufacture process, determine the number of wafers or wafer lots of product P waiting to be processed by machines in a building B (e.g., 106A-106D as shown in FIG. 1). In this disclosure, a wafer or a wafer lot is assumed to undergo N fabrication steps (where N>1) in the manufacture process before finally being converted into the end product (e.g., an integrated circuit). Step S is one of the N steps, and S-1 steps had been performed prior to the S step. When a number of wafers or wafer lots had undergone the processing of step S-1, these wafers or wafer lots may need to be transported to machines performing step S in the same or a different building. Implementations of the present disclosure may determine one of the buildings to which these wafers or wafer lots that had undergone S-1 steps should be shipped based on certain rules.

Each machine capable of performing step S may already have wafers or wafer lots waiting to be processed. The number of waiting wafers or wafer lots may be represented by WIP (P, S, B), where P is the identifier for a product, S is the identifier for a step to be performed in the sequence of processing steps, and B is the identifier for the building housing fabrication machines. In one implementation, MES 102 may be associated with a database including a record of real-time information about the operation of the plant. In one implementation, WIP(P, S, B) may be specified according to the information provided by MES 102. The information may include the number of wafers or wafer lots of product P that are waiting to be processed in building B for step S, the number of wafers or wafer lots of product P that are being processed in building B for step S, the number of wafers or wafer lots of product P that are in the transportation system to be sent to each building B to be processed for step S, and the number of wafers or wafer lots of product P in any building that are just processed and need to be assigned to a machine in building B for the next processing step S. MES 102 may update these numbers stored in the record in real time through the operation of plant 100. Thus, part routing decision component 104 may calculate WIP (P, S, B) based on the current information stored in the record.

At 204, the processing device executing part routing decision component 104 may determine an estimate of the number of wafers or wafer lots that can be processed by fabrication machines for step S in building B in a future time period. The future time period can be a next number of hours (e.g., one hour, two hours etc.). The number of wafers or wafer lots that could be processed may be represented by Capability (P, S, B), where P is the identifier for a product, S is the identifier for the next step, and B is the identifier for buildings. Part routing decision component 104 can determines Capability (P, S, B) based on rules that are discussed in the following sections.

At 206, the processing device executing part routing decision component 104 may calculate a capability occupancy ratio $R_i$=WIP(P, S, $B_i$)/Capability(P, S, $B_i$), for each build i=1, 2, . . . , N in plant 100 where Capability(P, S, $B_i$) is not zero. The capability occupancy ratio $R_i$ may represent the portion of the production capability of a building that is being occupied by wafers or wafer lots waiting to be processed in that building. Thus, a smaller capability occupancy ratio $R_i$ represents more available capability (or less occupied) of machines in building B.

At 208, the processing device executing part routing decision component 104 may determine that the building $B_k$ has the least capability occupancy ratio and issue control instructions to transport wafer lots processed by a prior step (S-1) to building $B_k$ waiting for further processing of the step S.

At 210, after transporting the wafer lots to building $B_k$, the processing device executing part routing decision component 104 may update the record to reflect the current number of wafer lots waiting to be processed in building $B_k$. The updated information may be used to determine where to transport future wafers or wafer lots coming off step S-1.

The method 200 may be applied to each step in the series of steps to process wafer lots in the semiconductor product fabrication process. Although method 200 is discussed in terms of transportation to buildings, the same method is also applicable to transporting wafers or wafer lots to individual machines.

Part routing decision component 104 may calculate Capability (P, S, B) based on rules. In one implementation, the rule can be one to reduce the number of trips among buildings because trips between buildings take time and increase transportation cost. This rule may include at least one or all of the following elements:

For a building B, if WIP (P, S, B) is less than a threshold value (e.g. 3 wafers or wafer lots) and if there are fabrication machines in building B that can process product P at step S, wafer lots is to stay in building B.

When computing the estimate of Capability (P, S, B), the estimate for the current building of the wafer lots is amplified by a multiplication factor greater than one (e.g., 1.5). This approach favors the current building over transporting to other buildings. In one implementation, the rule may also take into consideration the distances from the current building of wafers or wafer lots to potential target buildings. For example, the rule may apply a penalty factor proportional to the distances, thus favoring to utilize fabrication machines in closer buildings than those in farther away buildings.

The rule may also take into consideration congestion state on the rails. The congestion state of a rail can be measured in terms of the number of carriers transporting parts on the rail. If the transportation system is congested (e.g., the number of carriers on the track is greater than a threshold value), an even greater multiplication factor may be given to the current building to further discourage the transportation to another building. If some routes of the transportation system are congested while other routes are not, the multiplication factor may be set higher only for the congested routes, depending on current building and next building.

The above rules favor to keep the wafers or wafer lots in its local building than moving them to another building in order to reduce the transportation cost.

In another implementation, Capability(P, S, B) may be estimated based on a rule (R1) taking into consideration factors such as, for example, current WIP, expected WIP in the future, other products (products other than P) and steps that may use the same equipment. Through simulation of the plant's expected operation in the future, part routing decision component 104 may calculate WIP(P, S, B) and Capability(P, S, B) of a future date when the wafer lots are processed. Other factors that may be used may include historical Capability(P, S, B) with respect to a time point (e.g., time of the day, month, year), WIP etc. Thus, the estimation of Capability(P, S, B) can be formulated as a data-driven learning problem that can be resolved by using a deep-learning neural network. In one implementation, part routing decision component 104 may calculate WIP(P, S, B) and the estimates of Capability(P, S, B) according to different time schedules. For example, part routing decision component 104 may calculate WIP(P, S, B) in real time through the manufacturing process but calculate the estimate of Capability(P, S, B) daily (or hourly, monthly).

In another implementation, the rule (R2) for calculating the estimate of Capability(P, S, B) may include the following elements:

Determining an uptime percentage (U) for each working machine, where U represents the percentage of time a machine works during a period of time (e.g., a day) vs. the total time in the period. A machine may be down for scheduled maintenance or repairs;

Determine the number of wafers or wafer lots (N) each machine can process product P at step S in a period of time (e.g., a day), when the machine is up and running; The number of wafer lots each machine can process depends on the time the machine takes to process the particular step, and the number of lots that can be processed together—a process known as batch. Since the machine can be used to process other products and other steps, a discount may be factored in to reflect the fact that the machine is not 100% reserved for product P at step S;

Calculate the estimate of Capability(P, S, B) as the sum of U*N over each workable machine in building B, for product P at step S. In this way, the estimate of Capability (P, S, B) can be calculated for a specific period of time (e.g., the following week).

The capability occupancy ratio $R_i$ may be calculated based on a real-time WIP(P, S, B), and the estimate of Capability(P, S, B).

In one implementation, plant 100 may already install MES 102 for scheduling of the placement of wafers or wafer lots. Part routing decision component 104 is an add-on component that further improve the functionality of MES 102. In some implementations, part routing decision component 104 may present MES 102 a list of wafer lots to move each day.

In an implementation of the present disclosure, part routing decision component 104 may present the list of wafer lots to transport for the day, and then make adjustment to the list based on the capability occupancy ratio calculated in real time. The adjusted list may contain the number of wafer lot moves, capability of machines, and optionally, the priority of wafer lots to be processed. Thus, the high-priority wafer lots may be processed ahead those of lower priority. This approach is more robust because it is based on the real-time information.

Table 1 shows an example performance of different approaches using different rules for a particular FAB. As shown in Table 1, the reference situation (Baseline) is when all machines in all buildings are considered to be connected by a transportation system with infinity capability and no time delay. The baseline is a benchmark of an ideal plant that does not exist in practice. The minTime is the rule to minimize the total production time for products. Under the minTime rule, a lot will always move to the building where the estimated remaining production time is the minimum. The minMove is the rule to minimize the number of transportation trips between buildings. Under the minMove rule, a lot will move to, or stay in, the building where the estimated future move is minimum, and the estimated remaining production time is within a given limit (e.g., 2 months). Rules R1 and R2 are discussed above.

TABLE 1

|  | Baseline | minTime | minMove | R1 | R2 |
|---|---|---|---|---|---|
| Total Trans (times) | 34 | 26 | 10 | 22 | 13 |
| Average Production Time (months) | 0.374 | 0.564 | 0.755 | 0.399 | 0.504 |

As shown in Table 1, the ideal baseline situation may take the least amount of time (0.3736 months on average) to produce a product, but achieving this by requiring a large number of transportation moves and by assuming no transportation delays. Other approaches should be compared to the baseline situation. Compared to the baseline, the approach using rule R1 to calculate the estimated Capability (P, S, B) may produce the best result (0.3991 months on average) while the approach using rule R2 to calculate the estimated Capability(P, S, B) may produce the second best result (0.504 months on average). Both of these approaches are superior to using the minTime rule or the minMove rule.

In an implementation, the transportation system of the semiconductor plant may not have real-time access to the MES. Instead, the plant may operate according to a list that specifies the number of wafers or wafer lots of each product P and step S that is to be transported from one building to another building. The part routing decision component 104 may first run a simulation, and then collect the wafers (or wafer lots) transportation history data to generate the list. The list may be generated and updated frequently (e.g., every six hours or 24 hours) to reflect the gradual deviation of the simulation prediction from the real fab conditions.

The following examples pertaining further embodiments. Example 1 is a method comprising responsive to identifying a part completed a step in a manufacture process, determining, by a processing device, a first number of parts waiting to be processed in a subsequent step by a plurality of machines housed in a plurality of buildings interconnected by rails, determining a second number of parts that the plurality of machines housed in the plurality of buildings is capable of processing in the subsequent step of the manufacture process over a determined period of time, calculating a capability occupancy ratio based on the first number and the second number for each one of the plurality of buildings, determining a target building of the plurality of buildings based on the capability occupancy ratio, and causing to dispatch the part to the target building via the rails.

Example 2 is a system comprising a storage device to store information of real-time operation of a plant, the plant comprising a plurality of machines in a plurality of buildings interconnected by rails and a processing device, communicatively coupled to the storage device, to responsive to identifying a part completed a step in a manufacture process, determine a first number of parts waiting to be processed in a subsequent step by the plurality of machines housed in the plurality of buildings, determine a second number of parts that the plurality of machines housed in the plurality of buildings is capable of processing in the subsequent step of the manufacture process over a determined period of time, calculate a capability occupancy ratio based on the first number and the second number for each one of the plurality of buildings, determine a target building of the plurality of buildings based on the capability occupancy ratio, and cause to dispatch the part to the target building via the rails.

Example 3 is non-transitory machine-readable storage medium storing instructions which, when executed, cause a processing device to responsive to identifying a part completed a step in a manufacture process, determine, by the processing device, a first number of parts waiting to be processed in a subsequent step by a plurality of machines housed in a plurality of buildings interconnected by rails, determine a second number of parts that the plurality of machines housed in the plurality of buildings is capable of processing in the subsequent step of the manufacture process over a determined period of time, calculate a capability occupancy ratio based on the first number and the second number for each one of the plurality of buildings, determine a target building of the plurality of buildings based on the capability occupancy ratio, and cause to dispatch the part to the target building via the rails.

FIG. 3 depicts a block diagram of a computer system operating in accordance with one or more aspects of the present disclosure. In various illustrative examples, computer system 300 may correspond to a computing device within MES 102 of FIG. 1.

In certain implementations, computer system 300 may be connected (e.g., via a network, such as a Local Area Network (LAN), an intranet, an extranet, or the Internet) to other computer systems. Computer system 300 may operate in the capacity of a server or a client computer in a client-server environment, or as a peer computer in a peer-to-peer or distributed network environment. Computer system 300 may be provided by a personal computer (PC), a tablet PC, a set-top box (STB), a Personal Digital Assistant (PDA), a cellular telephone, a web appliance, a server, a network router, switch or bridge, or any device capable of executing a set of instructions (sequential or otherwise) that specify actions to be taken by that device. Further, the term "computer" shall include any collection of computers that individually or jointly execute a set (or multiple sets) of instructions to perform any one or more of the methods described herein.

In a further aspect, the computer system 300 may include a processing device 302, a volatile memory 304 (e.g., random access memory (RAM)), a non-volatile memory 306 (e.g., read-only memory (ROM) or electrically-erasable programmable ROM (EEPROM)), and a data storage device 316, which may communicate with each other via a bus 308.

Processing device 302 may be provided by one or more processors such as a general purpose processor (such as, for example, a complex instruction set computing (CISC) microprocessor, a reduced instruction set computing (RISC) microprocessor, a very long instruction word (VLIW) microprocessor, a microprocessor implementing other types of instruction sets, or a microprocessor implementing a combination of types of instruction sets) or a specialized processor (such as, for example, an application specific integrated circuit (ASIC), a field programmable gate array (FPGA), a digital signal processor (DSP), or a network processor).

Computer system 300 may further include a network interface device 322. Computer system 300 also may include a video display unit 310 (e.g., an LCD), an alpha-numeric input device 312 (e.g., a keyboard), a cursor control device 314 (e.g., a mouse), and a signal generation device 320.

Data storage device 316 may include a non-transitory computer-readable storage medium 324 on which may store instructions 326 encoding any one or more of the methods or functions described herein, including instructions encoding output volume control of FIG. 1 for implementing method 200.

Instructions 326 may also reside, completely or partially, within volatile memory 304 and/or within processing device 302 during execution thereof by computer system 300, hence, volatile memory 304 and processing device 302 may also constitute machine-readable storage media.

While computer-readable storage medium 324 is shown in the illustrative examples as a single medium, the term "computer-readable storage medium" shall include a single medium or multiple media (e.g., a centralized or distributed database, and/or associated caches and servers) that store the one or more sets of executable instructions. The term "computer-readable storage medium" shall also include any tangible medium that is capable of storing or encoding a set of instructions for execution by a computer that cause the computer to perform any one or more of the methods described herein. The term "computer-readable storage medium" shall include, but not be limited to, solid-state memories, optical media, and magnetic media.

The methods, components, and features described herein may be implemented by discrete hardware components or may be integrated in the functionality of other hardware components such as ASICS, FPGAs, DSPs or similar devices. In addition, the methods, components, and features may be implemented by firmware modules or functional circuitry within hardware devices. Further, the methods, components, and features may be implemented in any combination of hardware devices and computer program components, or in computer programs.

Unless specifically stated otherwise, terms such as "receiving," "associating," "determining," "updating" or the like, refer to actions and processes performed or implemented by computer systems that manipulates and transforms data represented as physical (electronic) quantities within the computer system registers and memories into other data similarly represented as physical quantities within the computer system memories or registers or other such information storage, transmission or display devices. Also, the terms "first," "second," "third," "fourth," etc. as used herein are meant as labels to distinguish among different elements and may not have an ordinal meaning according to their numerical designation.

Examples described herein also relate to an apparatus for performing the methods described herein. This apparatus may be specially constructed for performing the methods described herein, or it may comprise a general purpose computer system selectively programmed by a computer program stored in the computer system. Such a computer program may be stored in a computer-readable tangible storage medium.

The methods and illustrative examples described herein are not inherently related to any particular computer or other apparatus. Various general purpose systems may be used in accordance with the teachings described herein, or it may prove convenient to construct more specialized apparatus to perform method 300 and/or each of its individual functions, routines, subroutines, or operations. Examples of the structure for a variety of these systems are set forth in the description above.

The above description is intended to be illustrative, and not restrictive. Although the present disclosure has been described with references to specific illustrative examples and implementations, it will be recognized that the present disclosure is not limited to the examples and implementations described. The scope of the disclosure should be determined with reference to the following claims, along with the full scope of equivalents to which the claims are entitled.

What is claimed is:

1. A method comprising:
   responsive to identifying a part completed a step in a manufacture process, determining, by a processing device, a first number of parts waiting to be processed in a subsequent step by a plurality of machines housed in a plurality of buildings interconnected by rails;
   determining a second number of parts that the plurality of machines housed in the plurality of buildings is capable of processing in the subsequent step of the manufacture process over a determined period of time;
   calculating a capability occupancy ratio based on the first number and the second number for each one of the plurality of buildings;
   determining a target building of the plurality of buildings based on the capability occupancy ratio; and
   causing to dispatch the part to the target building via the rails.

2. The method of claim 1, wherein the part is one of a semiconductor wafer or a semiconductor wafer lot, wherein the plurality of buildings composes of a semiconductor manufacture plant, and wherein the manufacture process comprises a plurality of steps to convert the semiconductor wafer to an end product.

3. The method of claim 1, wherein determining the target building comprises:
   determining the target building as one associated with a least capability occupancy ratio among the plurality of buildings.

4. The method of claim 1, wherein calculating the capability occupancy ratio comprises calculating the capability occupancy ratio based on one or more rules.

5. The method of claim 4, wherein the one or more rules comprises:
   responsive to determining that the first number of parts in a current building associated with the part is less than a threshold value, assigning the current building as the target building.

6. The method of claim 4, wherein the one or more rules comprises:
amplifying the second number associated with a current building in which the part is located.

7. The method of claim 4, wherein the one or more rules comprises:
determining a congestion state associated with each one of the rails; and
determining the target building as a building connected by least congested rail based on the congestion state.

8. The method of claim 1, wherein determining the first number of parts waiting to be processed comprises determining the first number of parts based on real-time information stored in a data record of a manufacture execution system; and
wherein determining the second number of parts that the plurality of machines housed in the plurality of buildings further comprises: estimating the second number of parts based on a simulation of operation of the plurality of machines housed in the plurality of buildings in a future time period.

9. The method of claim 8, wherein estimating the second number of parts that the plurality of machines housed in the plurality of buildings further comprises:
calculating an uptime percentage for each one of the plurality of machines;
determining, based on a duration to process each part, a third number of parts that each one of the plurality of machines is capable of processing over the determined period of time; and
estimating the second number of parts based on the uptime percentage and the third number.

10. A system, comprises:
a storage device to store information of real-time operation of a plant, the plant comprising a plurality of machines in a plurality of buildings interconnected by rails; and
a processing device, communicatively coupled to the storage device, to:
responsive to identifying a part completed a step in a manufacture process, determine a first number of parts waiting to be processed in a subsequent step by the plurality of machines housed in the plurality of buildings;
determine a second number of parts that the plurality of machines housed in the plurality of buildings is capable of processing in the subsequent step of the manufacture process over a determined period of time;
calculate a capability occupancy ratio based on the first number and the second number for each one of the plurality of buildings;
determine a target building of the plurality of buildings based on the capability occupancy ratio; and
cause to dispatch the part to the target building via the rails.

11. The system of claim 10, wherein the part is one of a semiconductor wafer or a semiconductor wafer lot, wherein the plurality of buildings composes of a semiconductor manufacture plant, and wherein the manufacture process comprises a plurality of steps to convert the semiconductor wafer to an end product.

12. The system of claim 10, wherein to determine the target building, the processing device is further to determine the target building as one associated with a least capability occupancy ratio among the plurality of buildings.

13. The system of claim 10, wherein to calculate the capability occupancy ratio, the processing device is further to calculate the capability occupancy ratio based on one or more rules.

14. The system of claim 13, wherein the one or more rules comprises:
responsive to determining that the first number of parts in a current building associated with the part is less than a threshold value, assigning the current building as the target building.

15. The system of claim 14, wherein the one or more rules comprises:
amplifying the second number associated with a current building in which the part is located.

16. The system of claim 14, wherein the one or more rules comprises:
determining a congestion state associated with each one of the rails; and
determining the target building as a building connected by least congested rail based on the congestion state.

17. The system of claim 10, wherein to determine the first number of parts waiting to be processed, the processing device is further to determine the first number of parts based on real-time information stored in a data record of a manufacture execution system; and
wherein to determine the second number of parts that the plurality of machines housed in the plurality of buildings, the processing device is further to: estimate the second number of parts based on a simulation of operation of the plurality of machines housed in the plurality of buildings in a future time period.

18. The system of claim 17, wherein to estimate the second number of parts that the plurality of machines housed in the plurality of buildings, the processing device is further to:
calculate an uptime percentage for each one of the plurality of machines;
determine, based on a duration to process each part, a third number of parts that each one of the plurality of machines is capable of processing over the determined period of time; and
estimate the second number of parts based on the uptime percentage and the third number.

19. A non-transitory machine-readable storage medium storing instructions which, when executed, cause a processing device to:
responsive to identifying a part completed a step in a manufacture process, determine, by the processing device, a first number of parts waiting to be processed in a subsequent step by a plurality of machines housed in a plurality of buildings interconnected by rails;
determine a second number of parts that the plurality of machines housed in the plurality of buildings is capable of processing in the subsequent step of the manufacture process over a determined period of time;
calculate a capability occupancy ratio based on the first number and the second number for each one of the plurality of buildings;
determine a target building of the plurality of buildings based on the capability occupancy ratio; and
cause to dispatch the part to the target building via the rails.

20. The non-transitory machine-readable storage medium of claim 19, wherein the part is one of a semiconductor wafer or a semiconductor wafer lot, wherein the plurality of buildings composes of a semiconductor manufacture plant, and wherein the manufacture process comprises a plurality of steps to convert the semiconductor wafer to an end product.

\* \* \* \* \*